(12) United States Patent
Ichikawa et al.

(10) Patent No.: US 12,027,377 B2
(45) Date of Patent: Jul. 2, 2024

(54) MANUFACTURING METHOD OF SEMICONDUCTOR DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Shuhei Ichikawa, Nisshin (JP); Hiroki Miyake, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 286 days.

(21) Appl. No.: 17/535,276

(22) Filed: Nov. 24, 2021

(65) Prior Publication Data

US 2022/0189787 A1    Jun. 16, 2022

(30) Foreign Application Priority Data

Dec. 11, 2020 (JP) ................... 2020-206249

(51) Int. Cl.
*H01L 21/425* (2006.01)
*H01L 29/66* (2006.01)
*H01L 29/872* (2006.01)

(52) U.S. Cl.
CPC ...... *H01L 21/425* (2013.01); *H01L 29/66969* (2013.01); *H01L 29/872* (2013.01)

(58) Field of Classification Search
CPC .. H01L 21/425; H01L 29/36; H01L 29/66969
See application file for complete search history.

(56) References Cited

U.S. PATENT DOCUMENTS

| | | | |
|---|---|---|---|
| 2016/0042949 A1* | 2/2016 | Sasaki | H01L 27/0605 |
| | | | 257/617 |
| 2017/0278933 A1* | 9/2017 | Sasaki | H01L 29/105 |
| 2018/0240914 A1 | 8/2018 | Nagaoka | |

OTHER PUBLICATIONS

Lin et al., "Vertical Ga2O3 Schottky Barrier Diodes with Guard Ring Formed by Nitrogen-Ion Implantation", IEEE Electron Device Letters, vol. 40, No. 9, Sep. 2019, pp. 1487-1490 (Year: 2019).*

* cited by examiner

*Primary Examiner* — Incent Wall
(74) *Attorney, Agent, or Firm* — Posz Law Group, PLC

(57) ABSTRACT

A manufacturing method of a semiconductor device includes: preparing a semiconductor substrate including a first semiconductor layer made of gallium oxide containing Sn and a second semiconductor layer disposed on the first semiconductor layer and made of n type gallium oxide having a Sn concentration lower than a Sn concentration of the first semiconductor layer; implanting ions of a group 2 element into the second semiconductor layer; and forming a diffusion region, in which the group 2 element diffuses, in a range from a surface of the second semiconductor layer to an interface between the second semiconductor layer and the first semiconductor layer.

6 Claims, 3 Drawing Sheets

MANUFACTURING METHOD OF SEMICONDUCTOR DEVICE

CROSS REFERENCE TO RELATED APPLICATION

The present application claims the benefit of priority from Japanese Patent Application No. 2020-206249 filed on Dec. 11, 2020. The entire disclosure of the above application is incorporated herein by reference.

TECHNICAL FIELD

The present disclosure relates to a manufacturing method of a semiconductor device.

BACKGROUND

There has been known a technique for implanting ions such as Mg into a semiconductor substrate made of gallium oxide. By this technique, a semiconductor layer having a low n-type carrier concentration is formed.

A relevant technology is now described only for understanding the following embodiments. A carrier concentration in gallium oxide can be controlled by implanting ions of a group 2 element such as Mg into a semiconductor substrate made of gallium oxide. For example, by implanting ions of a group 2 element into a gallium oxide substrate, a semiconductor layer having a low n-type carrier concentration can be formed, or a p-type semiconductor layer can be formed. In this type of technique, the semiconductor substrate is subjected to a heat treatment after the ion implantation. The heat treatment activates the element implanted into the semiconductor substrate. In addition, the heat treatment causes the element implanted into the semiconductor substrate to diffuse in the semiconductor substrate. In a conventional technique, it has been difficult to control the thickness of the diffusion region of the implanted element when a group 2 element is implanted into a semiconductor substrate made of gallium oxide. Therefore, there are cases where the element is diffused too much and the thickness of the diffusion region becomes excessively thick, or the diffusion of the element is insufficient and the thickness of the diffusion region becomes excessively thin.

SUMMARY

The present disclosure provides a manufacturing method of a semiconductor device including: preparing a semiconductor substrate including a first semiconductor layer made of gallium oxide containing Sn and a second semiconductor layer disposed on the first semiconductor layer and made of n type gallium oxide having a Sn concentration lower than a Sn concentration of the first semiconductor layer; implanting ions of a group 2 element into the second semiconductor layer; and forming a diffusion region, in which the group 2 element diffuses, in a range from a surface of the second semiconductor layer to an interface between the second semiconductor layer and the first semiconductor layer.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
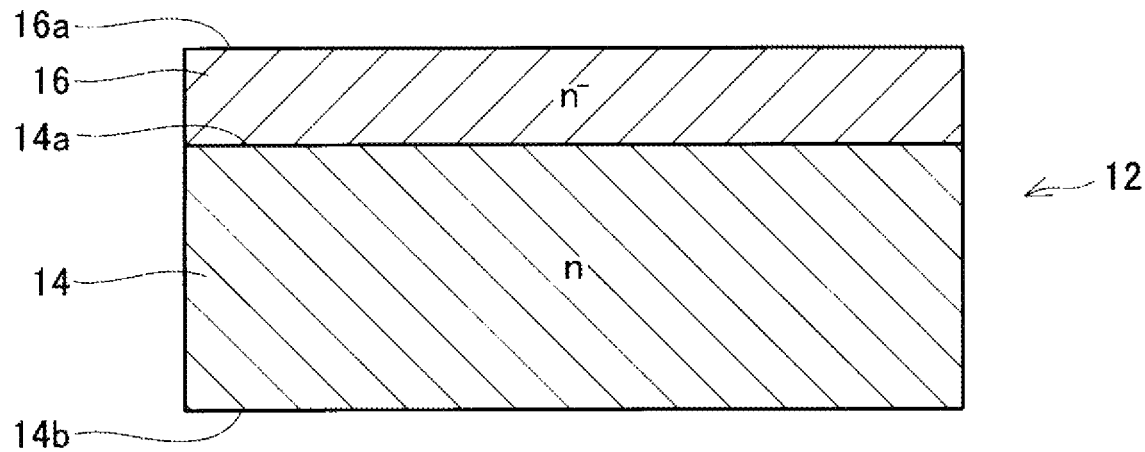
FIG. 1 is a cross-sectional view of a semiconductor substrate.

A manufacturing method of a semiconductor device according to an aspect of the present disclosure includes: preparing a semiconductor substrate including a first semiconductor layer and a second semiconductor layer disposed on the first semiconductor layer, the first semiconductor layer made of gallium oxide containing Sn, the second semiconductor layer made of n type gallium oxide having a Sn concentration lower than a Sn concentration of the first semiconductor layer; implanting ions of a group 2 element into the second semiconductor layer; and forming a diffusion region, in which the group 2 element diffuses, in a range from a surface of the second semiconductor layer to an interface between the second semiconductor layer and the first semiconductor layer.

From the experiment by the inventors, it was found that the diffusion of the group 2 element was suppressed in gallium oxide having a high Sn concentration. In the semiconductor substrate, the first semiconductor layer is made of gallium oxide having a high Sn concentration, and the second semiconductor layer is made of gallium oxide having the low Sn concentration. In the ion implantation, the ions of the group 2 element are implanted into the second semiconductor layer made of gallium oxide having the low Sn concentration, and the diffusion region is formed by heat treating the semiconductor substrate. During the heat treatment, the group 2 element implanted into the second semiconductor layer easily diffuses in the second semiconductor layer having the low Sn concentration. Therefore, it is possible to form the diffusion region, in which the group 2 element diffuses, in the range from the surface of the second semiconductor layer to the interface between the second semiconductor layer and the first semiconductor layer. Since the Sn concentration in the first semiconductor layer is high, it is possible to prevent the group 2 element diffused to the interface between the second semiconductor layer and the first semiconductor layer from further diffusing into the first semiconductor layer. Therefore, the thickness of the diffusion region can be accurately controlled to be substantially the same as the thickness from the surface of the second semiconductor layer to the interface between the second semiconductor layer and the first semiconductor layer.

The technical elements disclosed herein are listed below. The following technical elements are useful independently.

In the manufacturing method according to the above aspect of the present disclosure, the Sn concentration of the first semiconductor layer may be $1 \times 10^{17}$ cm$^{-3}$ or more.

When the Sn concentration of the first semiconductor layer is set to $1 \times 10^{17}$ cm$^{-3}$ or more, the diffusion of the group 2 element in the first semiconductor layer can be suppressed more effectively.

The manufacturing method according to the above aspect of the present disclosure may further include forming a Schottky electrode on the surface of the second semiconductor layer in such a manner that the Schottky electrode covers a range from a surface of a non-diffusion region other than the diffusion region to a surface of the diffusion region, an end portion of the Schottky electrode is located above the diffusion region, and the Schottky electrode comes into Schottky contact with the non-diffusion region.

According to the above configuration, the electric field concentration around the end of the Schottky electrode can be suppressed.

In the manufacturing method of the present embodiment, first, a semiconductor substrate 12 shown in FIG. 1 is prepared. A semiconductor device is manufactured from the semiconductor substrate 12. The semiconductor substrate 12 is made of β-type gallium oxide (that is, β-Ga$_2$O$_3$). The semiconductor substrate 12 includes a Sn-doped layer 14 and a drift layer 16.

The Sn-doped layer 14 is made of a Sn-doped β-Ga$_2$O$_3$ single crystal. An upper surface of the Sn-doped layer 14 can be a (001) surface. A thickness of the Sn-doped layer 14 can be about 400 μm. A Sn concentration of the Sn-doped layer 14 can be $1 \times 10^{17}$ cm$^{-3}$ or more. Sn functions as a donor in gallium oxide. Therefore, the Sn-doped layer 14 is an n-type layer. An n-type carrier concentration of the Sn-doped layer 14 can be $1 \times 10^{17}$ cm$^{-3}$ or more.

The drift layer 16 is disposed on the Sn-doped layer 14 and is in contact with the upper surface of the Sn-doped layer 14. That is, the upper surface is an interface 14a between the drift layer 16 and the Sn-doped layer 14. The drift layer 16 is made of a single crystal of β-Ga$_2$O$_3$ doped with Si (silicon). An upper surface 16a of the drift layer 16 can be a (001) surface. A thickness of the drift layer 16 can be 1 μm or more, for example, about 5 μm. A Si concentration of the drift layer 16 can be, for example, about $2 \times 10^{16}$ cm$^{-3}$. Si functions as a donor in gallium oxide. The drift layer 16 is an n-type layer having an n-type carrier concentration (for example, about $2 \times 10^{16}$ cm$^{-3}$) lower than the Sn-doped layer 14. The Sn concentration of the drift layer 16 is lower than the Sn concentration of the Sn-doped layer 14. For example, the Sn concentration of the drift layer 16 can be less than $1 \times 10^{17}$ cm$^{-3}$. The drift layer 16 may be substantially free of Sn, or may contain Sn at a low concentration. The drift layer 16 can be formed by epitaxial growth. Alternatively, the semiconductor substrate 12 in which the drift layer 16 is already formed on the Sn-doped layer 14 may be purchased.

Figure 2:
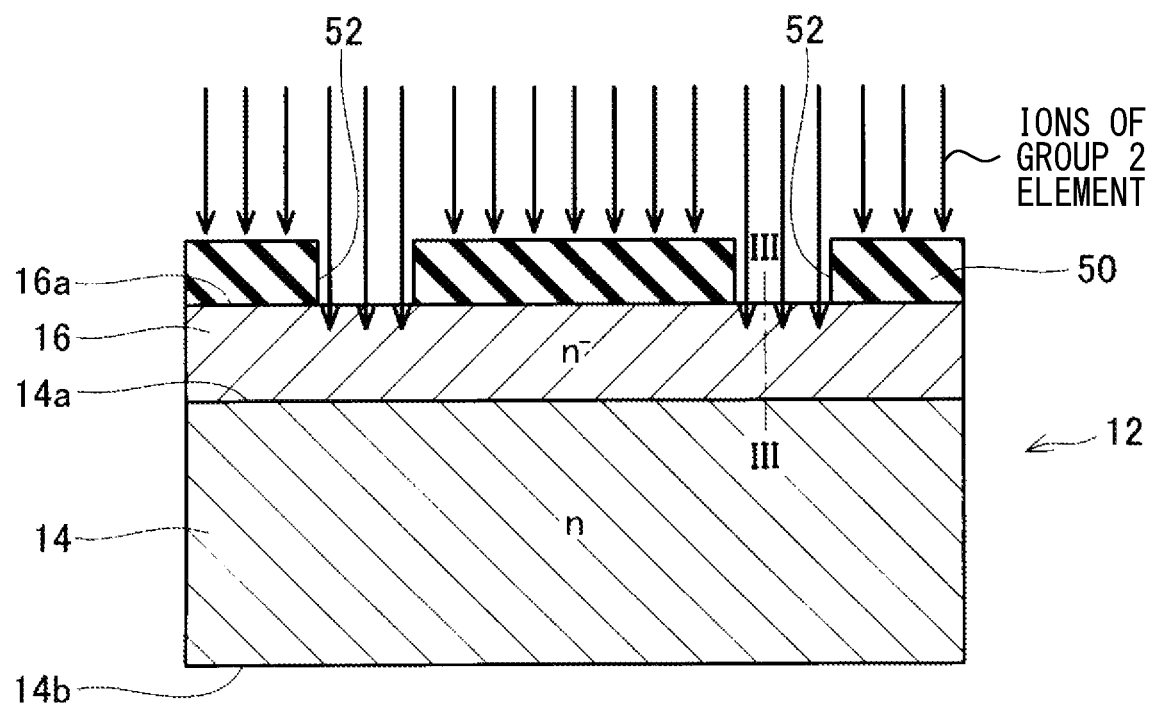
FIG. 2 is an explanatory diagram of an ion implantation process.

After the semiconductor substrate 12 is prepared, a resist 50 is formed on the upper surface 16a of the drift layer 16 by photolithography as shown in FIG. 2. Here, the resist 50 having an opening 52 is formed. The upper surface 16a of the drift layer 16 is exposed in the opening 52. After forming the resist 50, a group 2 element is ion-implanted into the drift layer 16 through the resist 50. As the group 2 element, at least one of Be (beryllium), Mg (magnesium), Ca (calcium), Sr (strontium), and Ba (barium) can be ion-implanted. In a range where the resist 50 is present, the resist 50 prevents the implantation of the group 2 element into the drift layer 16. Therefore, the group 2 element is implanted into the drift layer 16 within the opening 52. Here, the group 2 element is implanted into a shallow position in the vicinity of the upper surface 16a of the drift layer 16. After the ion implantation, the resist 50 is removed.

Figure 3:
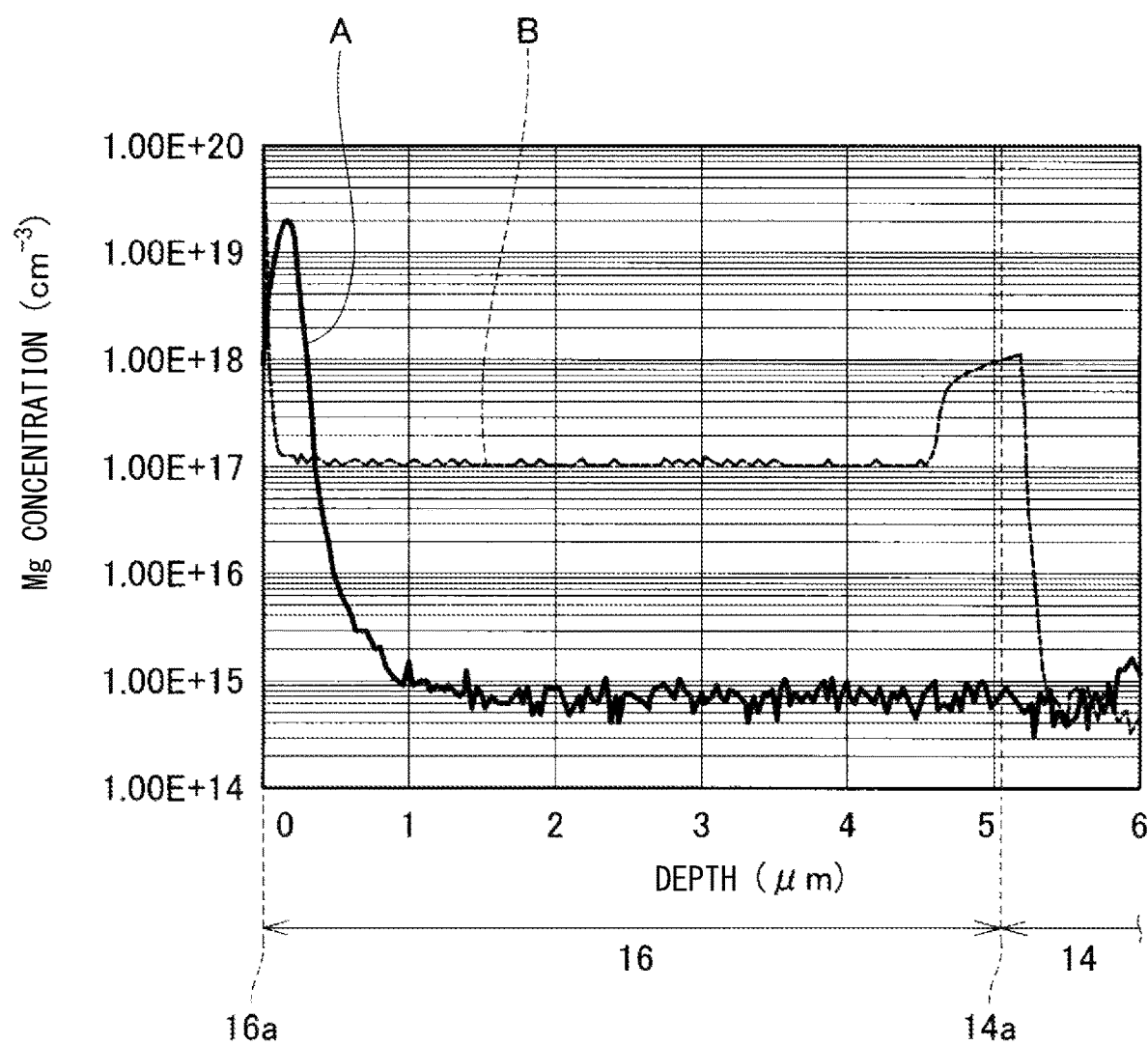
FIG. 3 is a graph illustrating a Mg concentration at a position of line III-III in FIG. 2.

FIG. 3 shows a distribution of a concentration of Mg when Mg is implanted into the drift layer 16 as the group 2 element. FIG. 3 shows the concentration distribution at the position of line III-III in FIG. 2 (that is, in the semiconductor substrate 12 below the opening 52). FIG. 3 shows the concentration distribution when ions of Mg are implanted with the implantation energy of 140 keV and the dose amount of $5 \times 10^{14}$ cm$^{-2}$. The solid line A in FIG. 3 shows the concentration distribution immediately after ion implantation (that is, before a heat treatment described later), and the dashed line B in FIG. 3 shows the concentration distribution after the heat treatment. As shown by the solid line A, immediately after the ion implantation, most of the implanted Mg is present in a depth range in the vicinity of the upper surface 16a of the drift layer 16 (that is, the range of the depth of 1 μm or less). In particular, the Mg concentration is high in the depth range of 0.1 to 0.3 μm. In the range where the depth is deeper than 1 μm, the concentration of Mg is low. In the range where the depth is deeper than 1 μm, the Mg concentration is around $1 \times 10^{15}$ cm$^{-3}$, which is the lower limit of detection.

Figure 4:
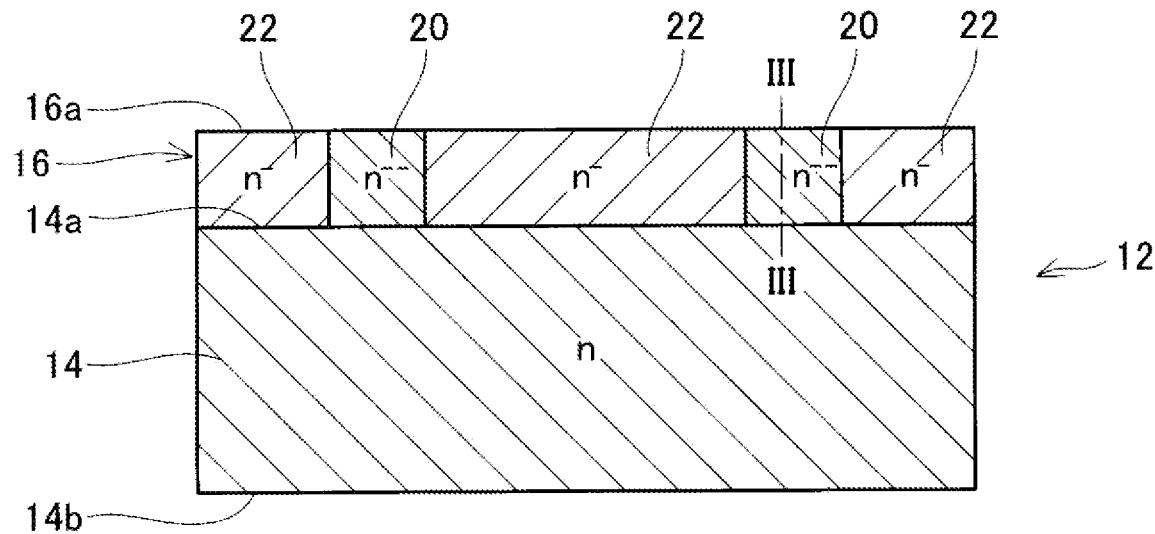
FIG. 4 is a cross-sectional view of the semiconductor substrate after heat treatment.

Next, the semiconductor substrate 12 is subjected to the heat treatment. For example, the semiconductor substrate 12 can be subjected to the heat treatment at a temperature of 500° C. or higher. The group 2 element is likely to diffuse in the drift layer 16 having a low Sn concentration. Here, the group 2 element is diffused in the range from the upper surface 16a to the interface 14a. As a result, as shown in FIG. 4, a diffusion region 20 extending from the upper surface 16a to the interface 14a is formed. Further, in the range where the implantation of the group 2 element is prevented by the resist 50, a non-diffusion region 22 in which the group 2 element hardly diffuses remains. Further, the heat treatment of the semiconductor substrate 12 activates the group 2 element in the semiconductor substrate 12. When activated, the group 2 element replaces Ga in gallium oxide and becomes an acceptor. Therefore, when the group 2 element is activated, the n-type carriers in the drift layer 16 are reduced. Thus, the n-type carrier concentration in the diffusion region 20 is lower than the n-type carrier concentration in the non-diffusion region 22. Therefore, the conductivity in the diffusion region 20 is lower than the conductivity in the non-diffusion region 22. By carrying out the heat treatment in this way, the diffusion region 20 having a low conductivity and the non-diffusion region 22 having a high conductivity are formed in the drift layer 16.

Further, the group 2 element is difficult to diffuse in the Sn-doped layer 14 having a high Sn concentration. In particular, when the Sn concentration in the Sn-doped layer 14 is $1 \times 10^{17}$ cm$^{-3}$ or more, the group 2 element hardly diffuses in the Sn-doped layer 14. Therefore, the group 2 element diffused to the interface 14a hardly diffuses into the Sn-doped layer 14. Therefore, the expansion of the diffusion region 20 stops at the interface 14a. Therefore, as shown in FIG. 4, the diffusion region 20 is formed so that the position of the lower end of the diffusion region 20 substantially coincides with the interface 14a. Therefore, according to this manufacturing method, the diffusion region 20 having substantially the same thickness as the drift layer 16 can be formed. According to this manufacturing method, since the expansion of the diffusion region 20 is stopped at the interface 14a regardless of conditions (for example, temperature, time, etc.) of the heat treatment, variations in the thickness of the diffusion region 20 can be suppressed.

The dashed line B of FIG. 3 shows the Mg concentration distribution after heat-treating the semiconductor substrate 12 having the Mg concentration distribution of the solid line A at about 1000° C. for about 30 minutes. Since Mg is diffused from the upper surface 16a to the interface 14a in the drift layer 16 by the heat treatment, Mg is distributed from the upper surface 16a to the vicinity of the interface 14a at a constant concentration of about $1 \times 10^{17}$ cm$^{-3}$. The concentration of Mg rises to about $1 \times 10^{18}$ cm$^{-3}$ at the interface 14a and drops sharply to about $1 \times 10^{15}$ cm$^{-3}$ (that is, the lower limit of detection) in the Sn-doped layer 14. From this result, it can be seen that in the heat treatment, Mg diffuses in the drift layer 16 but hardly diffuses in the Sn-doped layer 14. Therefore, the diffusion region 20 extending from the upper surface 16a to the interface 14a and having a substantially constant Mg concentration can be formed in the drift layer 16.

Figure 5:
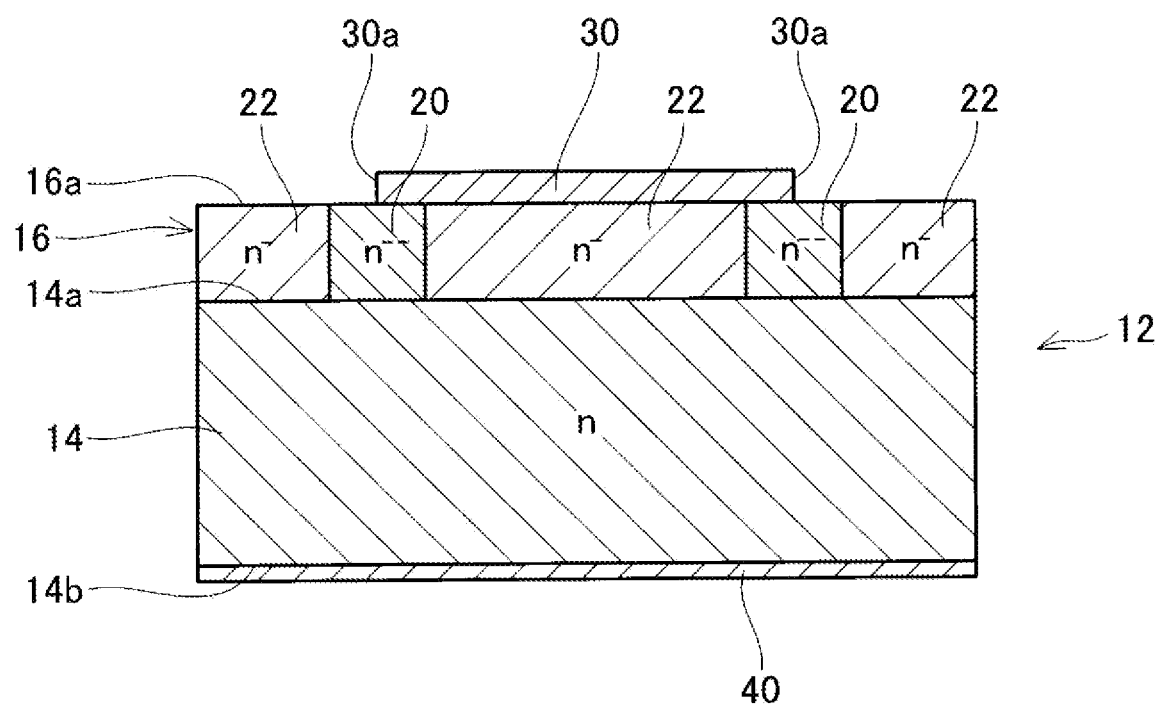
FIG. 5 is a cross-sectional view of the semiconductor substrate after electrodes are formed.

Next, as shown in FIG. 5, a Schottky electrode 30 is formed on the upper surface 16a of the drift layer 16. The Schottky electrode 30 is formed in such a manner that the Schottky electrode 30 covers a range extending from the surface of the non-diffusion region 22 to the surface of the diffusion region 20 and an outer peripheral end 30a of the Schottky electrode 30 is located above the diffusion region 20. The Schottky electrode 30 is in Schottky contact with the non-diffusion region 22. Next, an ohmic electrode 40 is formed on a lower surface 14b of the Sn-doped layer 14. The ohmic electrode 40 covers substantially the entire area of the lower surface 14b. The ohmic electrode 40 is in ohmic contact with the Sn-doped layer 14. Through the above processes, the semiconductor device (that is, a Schottky barrier diode) is completed.

As described above, the Schottky barrier diode can be manufactured according to this manufacturing method. When a reverse voltage is applied to the Schottky barrier diode, the drift layer 16 is depleted. At this time, the electric field tends to concentrate in a portion of the drift layer 16 in the vicinity of the outer peripheral end 30a of the Schottky electrode 30. However, in the Schottky barrier diode manufactured by the above manufacturing method, the diffusion region 20 having the low conductivity is disposed below the outer peripheral end 30a of the Schottky electrode 30. The diffusion region 20 suppresses the electric field concentration in the vicinity of the outer peripheral end 30a. Therefore, according to the above manufacturing method, a Schottky barrier diode having a high reverse breakdown voltage can be manufactured.

Further, in the above manufacturing method, since the group 2 element hardly diffuses into the Sn-doped layer 14, the diffusion range of the group 2 element can be limited to the inside of the drift layer 16 in the thickness direction of the semiconductor substrate 12. Therefore, the thickness of the diffusion region 20 can be substantially matched with the thickness of the drift layer 16. Therefore, it is possible to suppress variations in the thickness of the diffusion region 20. Therefore, at the time of mass production, it is possible to suppress variations in the reverse breakdown voltage of the Schottky barrier diode.

Further, in the above manufacturing method, since the group 2 element easily diffuses in the drift layer 16, it is possible to form the diffusion region 20 in which the concentration of the group 2 element is relatively constant. Therefore, the conductivity is relatively uniformly distributed in the diffusion region 20. Therefore, it is possible to suppress variations in the reverse breakdown voltage of the Schottky barrier diode.

In the above-described embodiment, the diffusion region 20 is the n-type layer having the low n-type carrier concentration. However, the diffusion region 20 may be a p-type layer. It is possible to suppress the electric field concentration in the vicinity of the outer peripheral end 30a also by forming the p-type diffusion region 20 below the outer peripheral end 30a of the Schottky electrode 30. The p-type diffusion region 20 may be formed by controlling the concentration of the group 2 element to be implanted.

Further, in the above-described embodiment, the group 2 element is implanted in the vicinity of the upper surface 16a of the drift layer 16 in the ion implantation. However, the depth at which the group 2 element is implanted into the drift layer 16 is optionally set. The group 2 element may be implanted at a position deeper than the above-described embodiment.

Although the Schottky barrier diode is formed in the above-described embodiment, the technique disclosed in the present disclosure may be used for manufacturing other semiconductor devices. This technique can be used in the manufacture of any semiconductor device having a diffusion region. According to this technique, in any semiconductor device having a diffusion region, it is possible to suppress variations in the thickness of the diffusion region and suppress variations in the characteristics of the semiconductor device.

The Sn-doped layer 14 of the above-described embodiment is an example of the first semiconductor layer. The drift layer 16 of the above-described embodiment is an example of the second semiconductor layer.

Although the embodiments have been described in detail above, these are merely examples and do not limit the scope of claims. The techniques described in the claims include various modifications and modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve a plurality of objectives at the same time, and achieving one of the objectives itself has technical usefulness.

What is claimed is:

1. A manufacturing method of a semiconductor device, comprising:
   preparing a semiconductor substrate including a first semiconductor layer and a second semiconductor layer disposed on the first semiconductor layer, the first semiconductor layer made of gallium oxide containing Sn, the second semiconductor layer made of n type gallium oxide having a Sn concentration lower than a Sn concentration of the first semiconductor layer;
   implanting ions of a group 2 element into the second semiconductor layer; and
   forming a diffusion region, in which the group 2 element diffuses, in extending from a surface of the second semiconductor layer to an interface between the second semiconductor layer and the first semiconductor layer.

2. The manufacturing method according to claim 1, wherein
   the Sn concentration of the first semiconductor layer is $1 \times 10^{17}$ cm$^{-3}$ or more.

3. The manufacturing method according to claim 1, further comprising
   forming a Schottky electrode on the surface of the second semiconductor layer in such a manner that the Schottky electrode covers a range extending from a surface of a non-diffusion region other than the diffusion region to a surface of the diffusion region, an end portion of the Schottky electrode is located above the diffusion region, and the Schottky electrode comes into Schottky contact with the non-diffusion region.

4. The manufacturing method according to claim 2, further comprising
   forming a Schottky electrode on the surface of the second semiconductor layer in such a manner that the Schottky electrode covers a range extending from a surface of a non-diffusion region other than the diffusion region to a surface of the diffusion region, an end portion of the Schottky electrode is located above the diffusion region, and the Schottky electrode comes into Schottky contact with the non-diffusion region.

5. The manufacturing method according to claim 1, wherein
the forming the diffusion region includes diffusing the group 2 element at an approximately constant concentration at a middle depth between the surface of the second semiconductor layer and the interface between the second semiconductor layer and the first semiconductor layer.

6. The manufacturing method according to claim 5, wherein
the forming the diffusion region further includes diffusing the group 2 element at a greater concentration than the approximately constant concentration at depths surrounding the middle depth, including near the surface of the second semiconductor layer and near the interface between the second semiconductor layer and the first semiconductor layer.

* * * * *